United States Patent
Christensen et al.

(10) Patent No.: US 7,218,543 B2
(45) Date of Patent: May 15, 2007

(54) ROM LOAD BALANCING FOR BIT LINES

(75) Inventors: Todd Alan Christensen, Rochester, MN (US); Ryan O'Neal Miller, Rochester, MN (US); Phil Paone, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 11/232,767

(22) Filed: Sep. 22, 2005

(65) Prior Publication Data

US 2007/0064463 A1   Mar. 22, 2007

(51) Int. Cl.
G11C 17/00 (2006.01)

(52) U.S. Cl. .......................... 365/94; 365/100

(58) Field of Classification Search .............. 365/94, 365/100, 104
See application file for complete search history.

(56) References Cited

U.S. PATENT DOCUMENTS 5,777,922 A * 7/1998 Choi et al. ............. 365/185.05
6,157,569 A * 12/2000 Nomura et al. ......... 365/185.11
6,791,860 B2 * 9/2004 Chen ......................... 365/104
6,795,350 B2 * 9/2004 Chen et al. ............ 365/189.07

OTHER PUBLICATIONS

R.R. Williams and P. Wu, IBM Technical Disclosure Bulletin, "Read-Only Storage Data Inversion for Speed Enhancement", vol. 22, No. 8B, Jan. 1980, pp. 3793-3794.

* cited by examiner

Primary Examiner—Anh Phung
(74) Attorney, Agent, or Firm—Robert R. Williams

(57) ABSTRACT

An apparatus and method to improve a cycle time of a Read Only Memory (ROM). Loading of each bit line is controlled such that no bit line has less than a specified loading fraction of a loading of a maximally loaded bit line. No additional space or additional circuitry is required. Four NFET pair arrangements are personalizable by via placement by a designer or design automation program. One of the NFET pair arrangements is usable to pad load on a bit line without altering a logical personalization of the bit line. Proper selection from the four NFET pair arrangements ensure that no bit line has less than the specified loading fraction of the loading of the maximally loaded bit line, as well as providing proper logical personality of the bit line.

16 Claims, 9 Drawing Sheets

ONE '0'S
10 LOADS

TWO '0'S
8 LOADS

THREE '0'S
9 LOADS

FOUR '0'S
10 LOAD

SIX '0'S
9 LOADS

EIGHT '0'S
8 LOADS

SEVEN '0'S
10 LOADS

16 '0'S
16 LOADS

ROM LOAD BALANCING FOR BIT LINES

BACKGROUND OF THE INVENTION

1. Field of the Invention

The current invention generally relates to Read Only Memory (ROM). In particular, the current invention relates to improving performance of a ROM by reducing loading variation on bit lines.

2. Description of the Related Art

Modern electronic systems, such as digital computers frequently have a need for Read Only Memory (ROM), sometimes also known as Read Only Storage (ROS). A ROM is a semiconductor array that is personalized during manufacture of a semiconductor chip containing the ROM, and cannot be subsequently changed (i.e. written to a different value).

A ROM produces a fixed output for a particular input. For example, an exemplary ROM receives an ASCII (American Standard Code for Information Interchange) character and outputs a number of bits that are coupled to a display, such as an LCD (Liquid Crystal Display), an LED (Light Emitting Diode) display, or a CRT (Cathode Ray Tube). The display is controlled by the bits driven by the ROM in such a way as to present a picture of the particular ASCII character for a user of the electronic system having the display. In another application, a computer instruction, or a portion of the computer instruction, is input to a ROM. Responsive to the computer instruction input to the ROM, the ROM outputs bits that control logic circuits in the electronic system to execute the computer instruction.

A ROM comprises an address input that is decoded such that a particular word line of a plurality of word lines is activated. Each word line in the plurality of word lines controls a switching element, typically a Field Effect Transistor (FET). Each switching element, if appropriately coupled to a bit line, is capable of discharging the bit line from a precharged state. If a particular switching element is not coupled to its particular bit line, the particular switching element can not discharge the bit line from the precharged state.

FIG. 1A shows a portion of a prior art ROM 10. Bit lines BLx0 and BLx1 are precharged by PFETs (P-channel Field Effect Transistors) Pxa and Pxb under control of a precharge signal PCx. While PCx is active ("0" in the example shown), Pxa and Pxb conduct, precharging bit lines BLx0 and BLx1. All word lines WLx0–WLx3 must be inactive ("0" in the example shown) while precharge signal PCx is active. A word line that is active when, precharge signal PCx is active would cause a bit line having a switch (an NFET (N-channel Field Effect Transistor) in the example of FIG. 1) controlled to discharge that bit line when that word line is active to contend with the current of precharge of the PFET that is trying to charge the bit line.

For example, if WLx0, in the group of word lines WLx0–WLx3 that are driven by an address decode (not shown), is active when precharge signal PCx is active, Nxa0 and Nxb0 will cause some or all of the currents of Pxa and Pxb to flow to ground, rather than having the currents of Pxa and Pxb precharge bit lines BLx0 and BLx1 as desired.

In the exemplary prior art ROM of FIG. 1A, during an evaluate phase when PCx is inactive ("1"), one of the word lines WLx0–WLx3 will be activated, and bit lines BLx0 and BLx1 will output a pattern dependent on how the switches controlled by the active word line are personalized. The personalization is done during manufacturing of the ROM.

In the exemplary ROM 10, NFETs Nxa0 and Nxb0 have gates coupled to word line WLx0; sources coupled to ground; and drains coupled to BLx0 and BLx1 respectively. Each drain (or, as explained later, a source) coupled to a bit line adds a load. Since both Nxa0 and Nxb0 will be made conductive by an active word line WLx0, and, since Pxa and Pxb are nonconducting (PCx is inactive when word line WLx0 is active), BLx0 and BLx1 are discharged to ground through Nxa0 and Nxb0, respectively.

Similarly, when WLx1 is activated during the evaluate phase, bit line BLx1 will be discharged through NFET Nxb1. Bit line BLx0 will not be discharged, since NFET Nxa1 is not coupled to bit line Nxb0. In a similar manner, bit line BLx1 will be discharged when WLx2 or WLx3 is activated during the evaluate phase by Nxb2 or Nxb3, respectively. Bit line BLx0 will not be discharged when WLx2 or WLx3 is activated during the evaluate phase because Nxa2 and Nxa3 are not coupled to bit line BLx0.

Bit line BLx0 is loaded only by capacitances of a drain of Pxa, a drain of Nxa1, and miscellaneous other parasitic capacitances between BLx0 and other wiring near bit line BLx0. Bit line BLx1 is loaded by capacitances of a drain of Pxb, and drains of Nxb0, Nxb1, Nxb2, and Nxb3, as well as other parasitic capacitances between bit line BLx1 and other wiring near bit line BLx1. Although only four word lines are shown for simplicity, typical bit lines may be programmed to be discharged or not discharged by a relatively large number of word lines, for examples, 16, 32, 64, or 128 word lines. Therefore there can be a very wide range in capacitive loading from one bit line to another bit line.

As shown in FIG. 1B, timings, even on a simple ROM, depend heavily on bit line capacitive loading. Using signals on nodes from FIG. 1A to illustrate timings, PCx drops at a first time, and must stay active long enough (PCx Min in FIG. 1B) to charge the most heavily loaded bit line; BLx1 in the example. BLx0 is precharged long before PCx is eventually allowed to go inactive. Word lines, as explained earlier, must not be allowed to go active until the precharge (PCx) goes inactive. When PCx is inactive, a word line, e.g., WLx0 goes active. Responsive to WLx0 going active, bit lines BLx0 and BLx1 are discharged. It will be noted that BLx1, being much more heavily loaded, takes much longer to discharge than bit line BLx0. WLx0 must remain active (and PCx must remain inactive) until BLx1, the heaviest loaded bit line, is discharged. This time is shown as WLx0 Min in FIG. 1B.

One solution to the problem of wide loading variations on bit lines is found in IBM Technical Disclosure Bulletin, vol. 22, no. 8B, January 1980, by Williams and Wu, hereinafter Williams. In Williams, each bit line is guaranteed to never be loaded by switches controlled by more than half of the word lines. In Williams, if a bit line would be loaded by switches controlled by more than half the bit lines, the bit line personalization is changed to be controlled by all the switches that would not have controlled it, with an inversion added to the output of the bit line. For example, if a bit line were to be loaded by switches controlled by all of the word lines, the personalization of that bit line would be changed so that that bit line is loaded by no switches, and the bit line logically inverted prior to being driven as an output of the ROM. This technique requires an inverter to be available for each bit line, the inverter being used on any bit line requiring inversion as described above.

Therefore, there is a need for a method and apparatus that reduce the loading variation on bit lines in a ROM without requiring additional circuitry.

SUMMARY OF THE INVENTION

The current invention teaches methods and apparatus that provide improved performance of a Read Only Memory (ROM) by reducing bit line loading variation. Logical personalization of the ROM may heavily load some bit lines, but leave other bit lines relatively very lightly loaded. Cycle time of ROMs is degraded by wide variation of loading on bit lines.

In an embodiment, a ROM comprises a plurality of word lines, and a plurality of bit lines. A maximally loaded bit line, having a first number of loads, in the plurality of bit lines is determined. Each bit line in the ROM is ensured to have at least enough loading to equal the load of the maximally loaded bit line times a loading fraction. The loading fraction is specified by a designer of the ROM or is defaulted in a design automation computer program.

In an embodiment, a plurality of bit lines is logically combined by a logic block such as a NAND. An NFET in a local evaluate is controlled by an output of the logic block. A drain of the NFET is coupled to a global bit line. The global bit line is discharged whenever a bit line is discharged. Each bit line is precharged under control of a local precharge signal. Each global bit line is precharged under control of a global precharge signal.

In a method embodiment, a user specifies a value for a loading fraction. A logical personalization of a ROM is specified and implemented by personalizing NFET pairs associated with each bit line. Each bit line is checked to ensure that loading of each bit line is at least equal to a load on a maximally loaded bit line times the loading fraction. If loading on a particular bit line is less than the load on the maximally loaded bit line times the loading fraction, an NFET pair associated with the particular bit line is personalized to add load to the particular bit line without changing the logical personalization of the particular bit line.

DETAILED DESCRIPTION OF THE PREFERRED EMBODIMENTS

The invention will be described in detail with reference to the figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

The current invention teaches a method and apparatus to improve a cycle time of a ROM (Read Only Memory) from a first word line activation to a second word line activation by reducing bit line capacitive loading variation and without introducing additional circuitry. All bit lines have the same phase in embodiments of the present invention.

Figure 2:
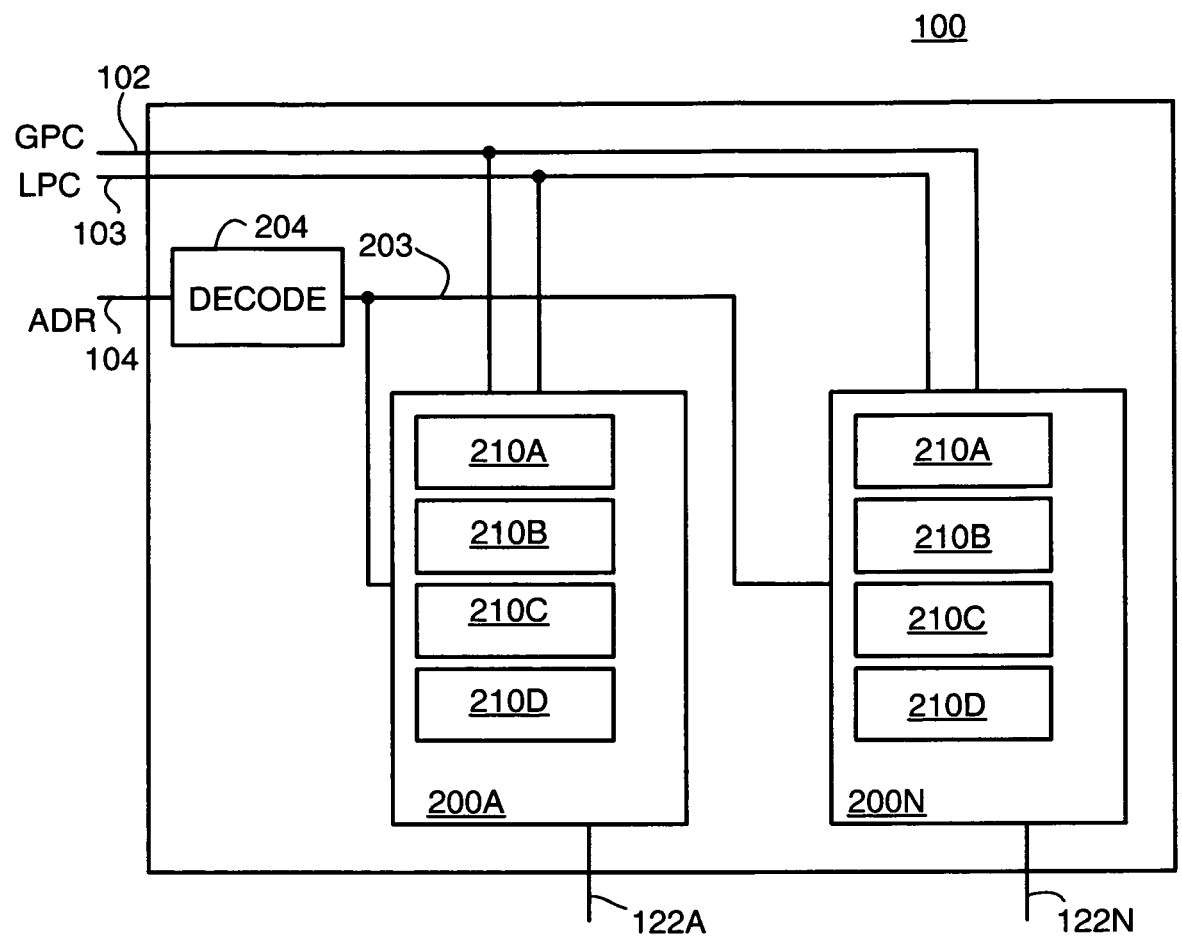
FIG. 2 shows a high level drawing of a ROM utilizing a hierarchical bit line structure suitable for the present invention.
Figure 3:
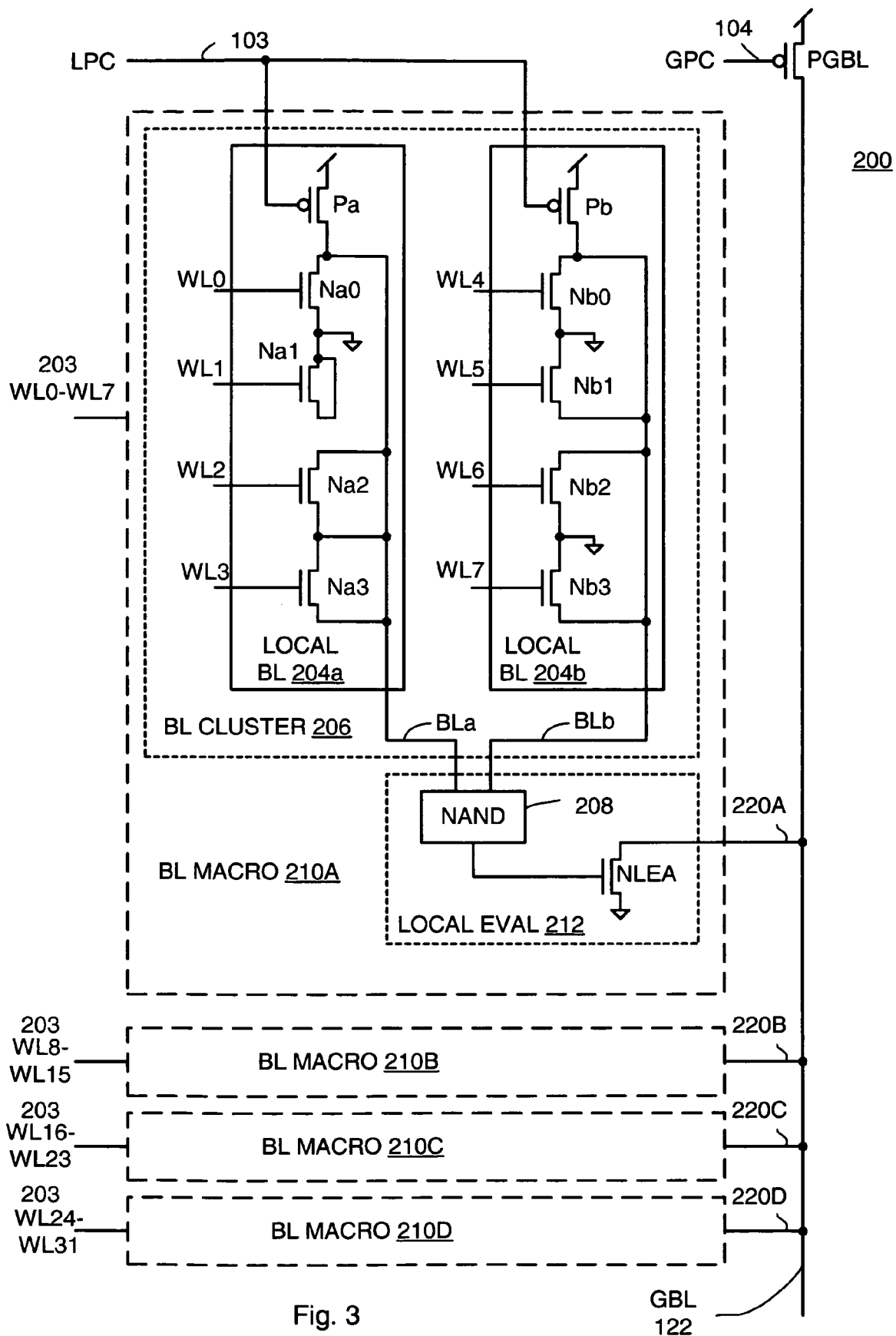
FIG. 3 is a detailed drawing of circuitry used for one hierarchical bit line structure.

Having reference now to the figures, FIG. 2 illustrates a high level diagram of a ROM 100. For performance reasons, ROMs with many word lines are designed in a hierarchical bit line fashion in order to keep a maximum loading on any bit line less than some specified maximum loading. ROM 100 receives as inputs a global precharge, GPC 102; a local precharge, LPC 103; an address, ADR 104; and outputs a number of global bit lines, 122A and 122N. Although only two global bit lines are shown, any number of global bit lines, including only one global bit line, is contemplated. ROM 100 includes a decode 204. Decode 204 activates one of a number of decoded word lines 203, responsive to ADR 104, during an evaluate phase. GPC 102 controls precharge of global bit lines (shown in detail in FIG. 3) during a global precharge phase. LPC 103 controls precharge of bit lines (shown in detail in FIG. 3) during a precharge phase. A hierarchical bit line structure 200, shown in detail in FIG. 3 is instantiated as 200A and 200N in FIG. 2; each instantiation 200A, 200N of hierarchical bit line structure 200 is personalized during manufacture to discharge or not discharge a particular global bit line 122A or 122N, as shown in FIG. 2. Hereafter, if a generic element such as hierarchical bit line structure 200 has a letter appended after the reference numeral, that reference numeral pertains to an instantiation of the generic element. Each hierarchical bit line structure 200 includes one or more bit line structures 210, shown instantiated as bit line structures 210A–210D in hierarchical bit line structure instantiations 200A and 200N.

FIG. 3 shows details of the hierarchical bit line structure 200. Hierarchical bit line structure 200 includes one or more bit line macros 210, shown as bit line macros 210A–210D. A bit line macro 210, as shown in an instantiation shown as bit line macro 210A, further includes a bit line cluster 206 and a local evaluate 212.

In the exemplary drawing of FIG. 3, decoded word lines 203 have 32 word lines, WL0–WL31. Word lines WL0–WL7 are coupled to bit line macro 210A; word lines WL8–WL15 are coupled to bit line macro 210B; word lines WL16–WL23 are coupled to bit line macro 210C; and word lines WL24–WL31 are coupled to bit line macro 210D.

A global bit line 122 is precharged by PFET PGBL when global precharge GPC 104 is active.

Figure 1A:
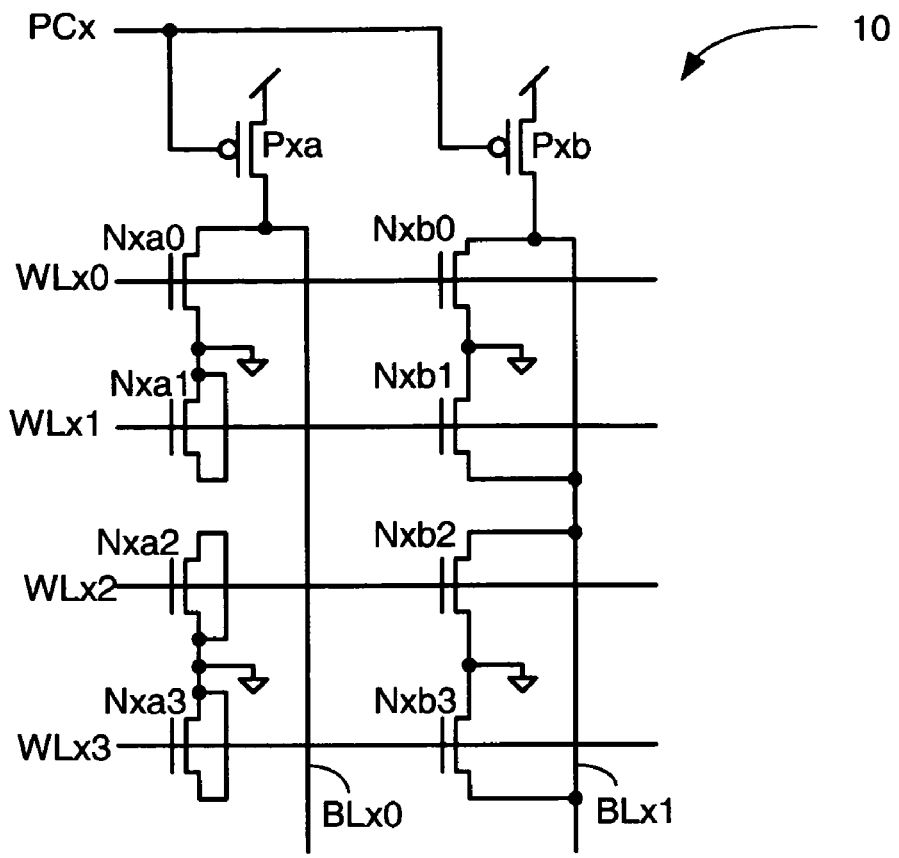
FIG. 1A is a prior art drawing that shows a portion of a ROM (Read Only Memory).
Figure 1B:
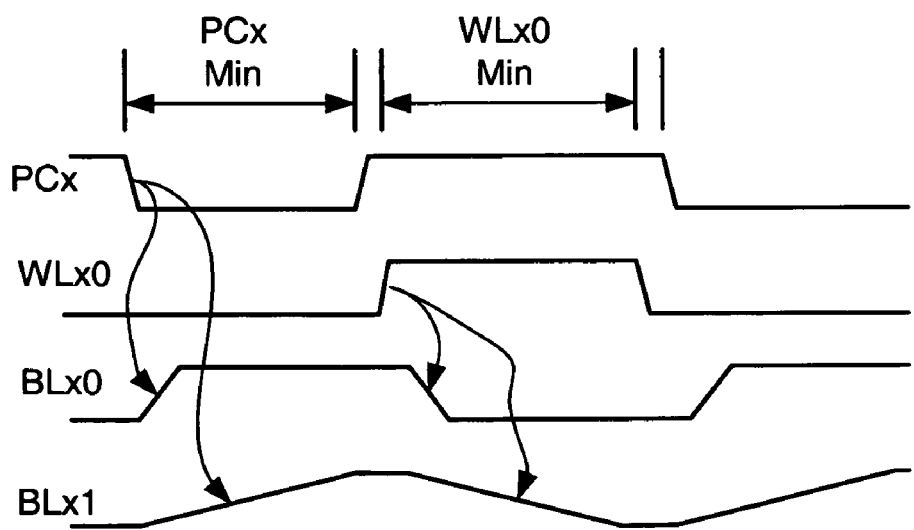
FIG. 1B is a prior art drawing that illustrates waveforms seen at nodes of the ROM of FIG. 1A.

Bit line cluster 206 contains one or more instantiations of a bit line structure 204, shown as bit line structures 204*a* and 204*b*. Although only two bit line structures 204*a* and 204*b* are shown, any number of bit line structure 204 instantiations is contemplated. Bit line structure 204*a* comprises a precharge switch, embodied as PFET Pa, controlled by local precharge LPC 103. Bit line BLa is discharged, depending on personalization, when word lines WL0–WL3 are active. As shown, bit line BLa is discharged by NFET Na0 when WL0 is active. NFET Na1 is not coupled to bit line BLa, so that bit line BLa will not be discharged when WL1 is active. Na1 has a source coupled to a drain coupled to ground. Na1, like other FETs in embodiments of the invention, has no floating drain or source. WL2 and WL3 likewise can not cause bit line BLa to be discharged. Na2 and Na3 have both their drains and sources coupled to bit line BLa. When, for example, WL2 is active, Na2 is turned on, but only ties bit line BLa to itself. Likewise, NFET Na3 can not cause bit line BLa to be discharged. It will be noted that the structure of WL2, Na2, WL3, Na3 in FIG. 3 has the same logical function as WLx2, Nxa2, WLx3, Nxa3 in FIG. 1A; that is, WLx2 and WLx3 can not cause bit line BLx0 to be discharged, and WL2 and WL3 can not cause bit line BLa to be discharged. However, Nxa2 and Nxa3 in FIG. 1 present no loading on bit line BLx0, whereas Na2 and Na3 in FIG. 3 present three loads on bit line BLa (approximately, and assuming a shared diffusion region between Na2 and Na3 as is shown in FIG. 5B and described in detail in the discussion with reference to FIG. 5). A load on a bit line is defined as a source or a drain node coupled to the bit line.

Bit line structure 204b in FIG. 3 produces a bit line BLb that is discharged when word lines WL4, WL5, WL6, or WL7 of decoded word lines 203 are active, discharging bit line BLb through NFETs Nb0, Nb1, Nb2, Nb3, respectively. Bit line BLb is precharged by PFET Pb when LPC is active.

Bit lines BLa and BLb are input to a NAND 208 in local evaluate 212. NAND 208 outputs a "1," if either BLa or BLb is discharged. The output of NAND 208 is coupled to a gate of NFET NLEA, driving node 220A on global bit line GBL 122. Bit line macros 210B, 210C, and 210D works in a similar manner, using different word lines of decoded word lines 203.

The hierarchical bit line structure 200 shown in FIG. 3 demonstrates that although global bit line GBL 122 logically depends on 32 bit lines, no bit line, either local (e.g., BLa, BLb, or the global bit line itself, GBL 122, can ever have more than four loads. It will be understood that the example hierarchical bit line structure 200 shown in FIG. 3 is simplified for instructional purposes. In general, far more than 32 word lines are typically required in ROM designs, and both bit lines and global bit lines can have far more than four loads.

ROM design using hierarchical bit line structures dramatically reduces the total number of loads that may be put on a particular bit line. For example, suppose that a particular bit line cluster (not shown) has four instantiations of bit line structure 204, and each instantiation has 16 word lines, allowing that particular bit line cluster to support 64 word lines, while having a maximum loading on any bit line of 16 loads. Further suppose that 16 instantiations of bit line macro 210 are used, placing 16 loads on the global bit line. Such a hierarchical bit line structure would handle 1024 word lines, with no bit line having more than 16 loads. Still, 1024 word lines represent only a 10-bit address 104, and larger addresses are contemplated.

Figure 4A:
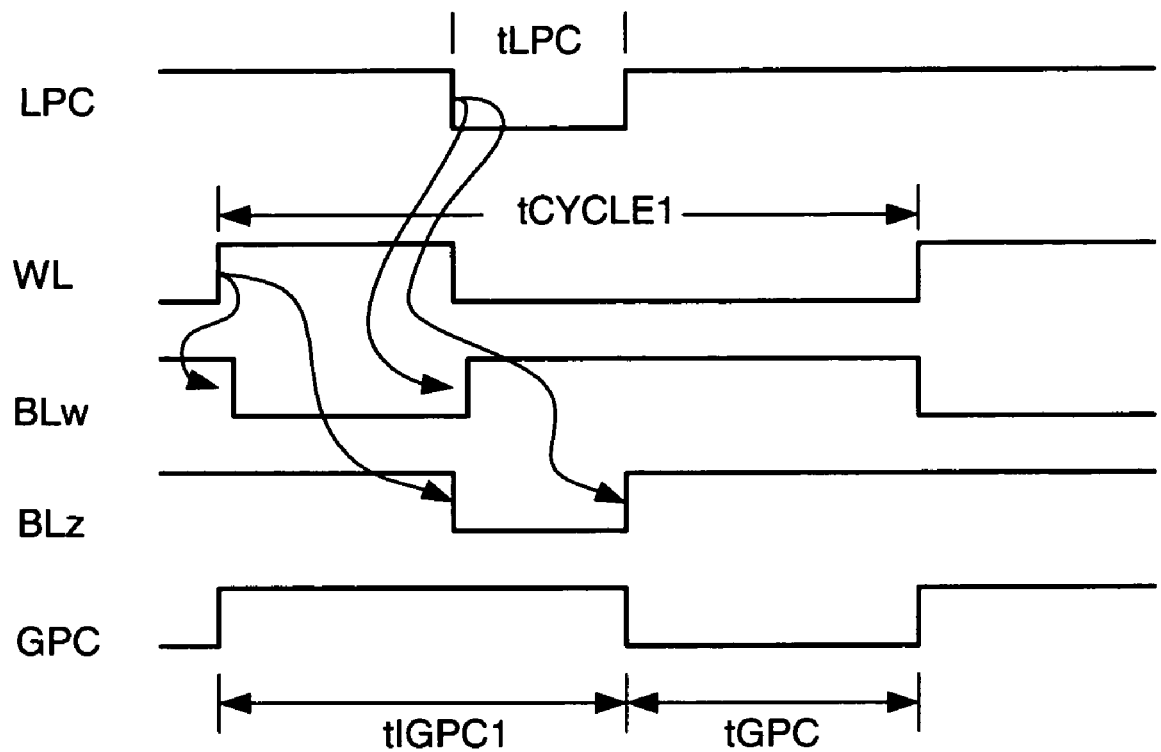
FIG. 4A shows waveforms on nodes in the hierarchical bit line structure having a first bit line loading.
Figure 4B:
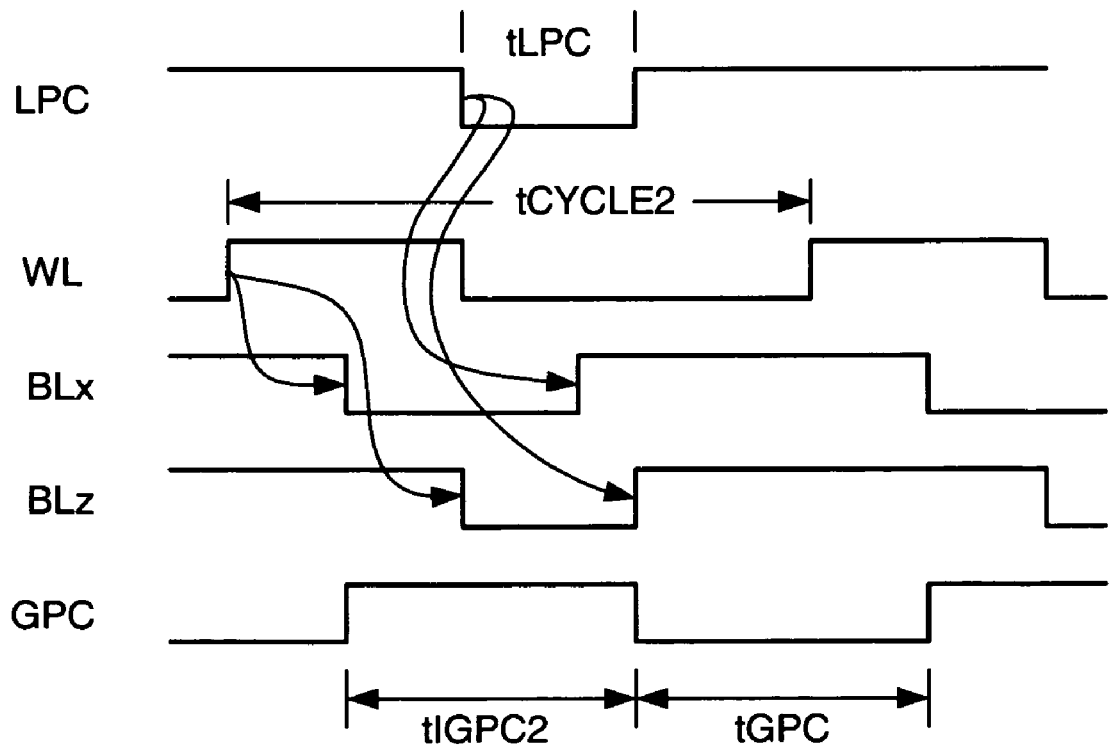
FIG. 4B shows waveforms on nodes in the hierarchical bit line structure having a second bit line loading.

FIGS. 4A and 4B show waveforms generally associated with a ROM using a hierarchical bit line structure as taught above. LPC is the local precharge described above (LPC 103 of FIG. 3). GPC is the global precharge (GPC 102 of FIG. 3). WL is any particular word line that is activated during the evaluation phase. BLw is a bit line in an instantiation of bit line 204 having a light loading. BLz is a bit line in an instantiation of bit line 204 having a maximum loading. Word line WL must be active long enough to allow discharge of the most heavily loaded bit line BLz. Note that lightly loaded bit line BLw falls very quickly responsive to WL rising. Local precharge must be active for some period of time (tLPC) sufficient for a precharge device to precharge BLz, the most heavily loaded bit line. It will be noted that BLw, the lightly loaded bit line, is quickly precharged; heavily loaded bit line BLZ takes longer to rise. Global precharge GPC must be inactive whenever any bit line is low, since a low bit line would cause a local evaluate 212 to be pulling a node, e.g., node 220A in FIG. 3, on a global bit line GBL 122 low. Margins and tolerances involved will be understood by those skilled in the art. For example, BLz is shown to fall essentially at the same time that LPC becomes active (falls). A designer will typically want to ensure that BLz falls before LPC becomes active, depending on the particulars of the designer's design. For example, BLz, being very heavily loaded, will, in practice, discharge relatively slowly, rather than the vertical fall shown for simplicity. The designer will ensure, prior to LPC becoming active (falling), that BLz has discharged at least far enough to be sensed at a down level.

In the case of FIG. 4A, where BLw is lightly loaded, tlGPC1, the required inactive time of global precharge GPC, lasts from the earliest fall of a bit line (BLw) to the latest rise of a bit line being precharged (BLz).

tGPC is the time required to precharge the most heavily loaded global bit line GBL 122. A minimum cycle time of the ROM using a hierarchical bit line structure is determined by tlGPC1+tGPC.

FIG. 4B shows a similar timing chart; however the most lightly loaded bit line, BLx is more heavily loaded than the most lightly loaded bit line of FIG. 4A, BLw. Note that BLx does not fall as quickly responsive to the rise of WL as did BLw. GPC needs only to be inactive when either BLx or BLz is "low". Since BLx falls later than BLw, tlGPC2 in FIG. 4B is less than tlGPC1 in FIG. 4A. Similarly, tCYCLE2 of FIG. 4B is less than tCYCLE1 of FIG. 4A. tCycle1 is the minimum cycle time of the ROM shown in FIG. 4A; tCycle2 is the minimum cycle time of the ROM shown in FIG. 4B.

The minimum cycle time of a ROM designed with a hierarchical bit line structure is reduced by the additional delay added to the most lightly loaded bit line. To achieve the absolutely fastest cycle time of the hierarchical ROM, all bit lines should be similarly loaded, with the most heavily loaded bit line determined by how many word lines must be able to discharge the most heavily loaded bit line.

Adding loading to lightly loaded bit lines increases power dissipated by the hierarchical ROM, since, on average, more capacitance must be discharged and charged. Therefore, amount of loading added is a power/performance tradeoff to be determined by a designer of the hierarchical ROM.

More significantly, however, in practical designs where additional chip real estate is not available to add loads, it may be impossible to guarantee that the most lightly loaded bit line has more than half the loading of the most heavily loaded bit line, as will be seen below with references to FIGS. 5A–5D.

It will be understood that the timings given in FIGS. 4A and 4B are simplified for exemplary purposes, and do not show timings that allow for tolerances and margins that will be understood by those of skill in the art.

ROM designs using polysilicon word lines typically have two NFETs sharing a common node, the two NFETs being in a single ROX (recessed oxide) area. That is, the NFETs are in NFET pairs. FIGS. 5A–5D show four personalizations of an NFET pair.

Figure 5A:
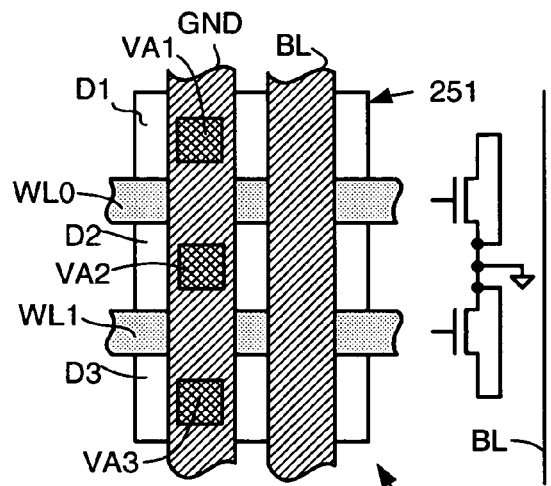
FIGS. 5A–5D shows physical layouts and corresponding circuit schematics of various personalities of a bit line pair.
Figure 5B:
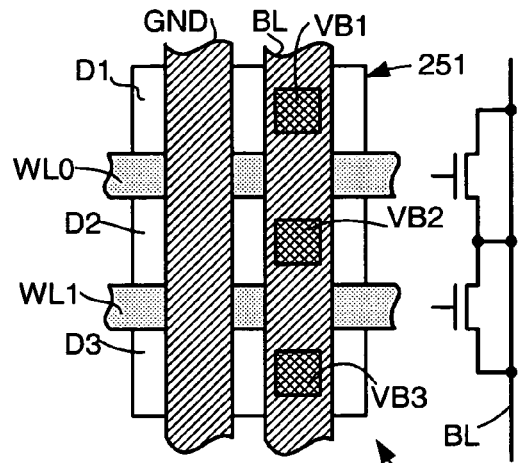

FIG. 5A shows an NFET pair, PAIRA 250A, which includes a ROX area 251 which contains two NFETs sharing a node D2. A first NFET has a drain D1, a source D2, and a gate coupled to WL0; WL0 being a word line such as WL0 of FIG. 3. It will be understood that word lines such as WL0–WL3 are polysilicon lines that carry the word line signals, the polysilicon conductor forming gates on NFETs where the polysilicon conductors pass over ROX areas. A second NFET in PAIRA 250A has a source D2 (shared with the source of the first NFET), a drain D3, and a gate coupled to WL1. WL1 is another word line such as WL1 of FIG. 3. Bit line BL is routed on a level of metal and continues on over as many NFET pairs as is implemented for the bit line BL. Similarly GND is coupled to a ground voltage supply; is on a level of metal; and continues over as many NFET pairs as is implemented for the bit line BL. D1, D2, D3, WL0, WL1, GND, BL, and ROX 251 are identical for all of the personalizations of the NFET pairs.

In PAIRA 250A, a first via VA1 between GND and D1, a second via VA2 between GND and D2, and a third via VA3 between GND and D3 connect sources and drains of the two NFETs to GND. No connection to bit line BL is made; that is, no loads are added to bit line BL in PAIRA 250A. A schematic of the two NFETs and their connections to GND is shown to the right of the physical layout in FIG. 5A. Neither WL0 nor WL1 being high causes bit line BL to be discharged.

FIG. 5B shows an NFET pair, PAIRB 250B, which is a padding NFET pair which is used to "pad" loads on a bit line without adding circuitry or changing personality of the bit line. Via VB1 connects BL to D1; via VB2 connects BL to D2; and via VB3 connects bit line BL to D3. D1, D2, and D3 present in total, three loads on bit line BL. A schematic of PAIRB 250B is shown at the right of the physical layout in FIG. 5B. Neither WL0 nor WL1 being high cause bit line BL to be discharged. Logically, therefore, PAIRB 250B is equivalent to PAIRA 250A.

Figure 5C:
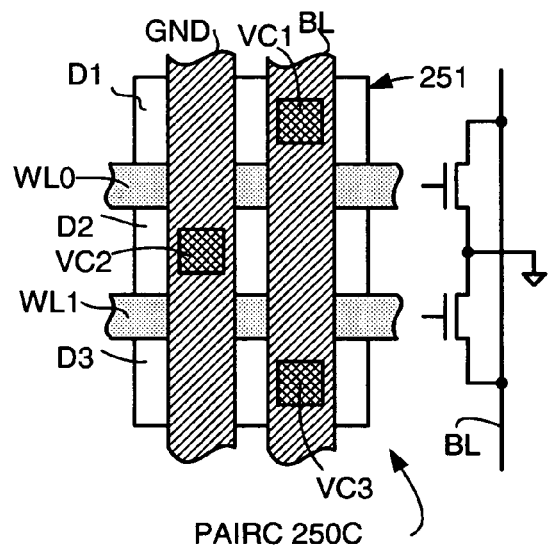

FIG. 5C shows an NFET pair, PAIRC 250C. Vias VC1, VC2, and VC3 connect drains D1 and D3 to bit line BL and shared source D2 to GND as shown. D1 and D2 together present two loads on bit line BL. A schematic of PAIRC 250C is shown at the right of the physical layout in FIG. 5C. In the NFET pair PAIRC 250C, bit line BL will be discharged whenever WL0 or WL1 is high.

Figure 5D:
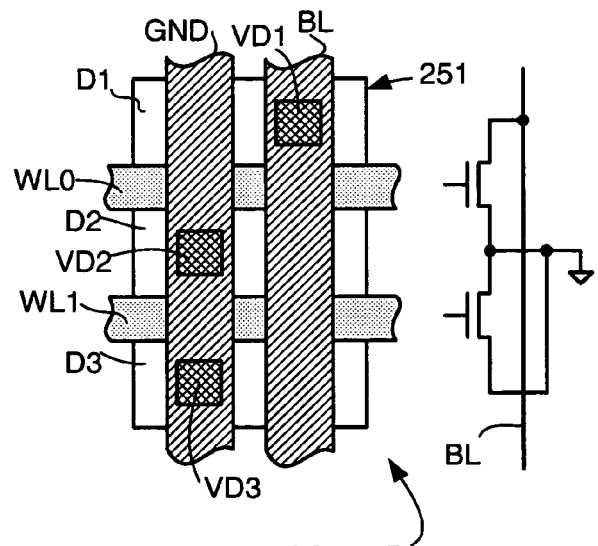

FIG. 5D shows an NFET pair, PAIRD 250D. Vias VD1, VD2, and VD3 that connect drain D1 to bit line BL; shared source D2 to GND; and D3 to GND, as shown. D1 presents one load on bit line BL. A schematic of PAIRD 250D is shown at the right of the physical layout in FIG. 5C. It will be understood that if WL1 were to be programmed to discharge bit line BL rather than WL0, VD1 would connect GND to D1 and VD3 would connect bit line BL to D3.

In summary, PAIRA 250A is an NFET pair in which neither word line (WL0, WL1) being high will cause a bit line BL to be discharged. PAIRA 250A adds zero loading to bit line BL. PAIRB is an NFET pair in which neither word line (WL0, WL1) being high will cause bit line BL to be discharged. PAIRB 250B adds three loads to bit line BL. PAIRC is an NFET pair in which either word line (WL0 or WL1) being high will discharge bit line BL. PAIRC 250C adds two loads to bit line BL. PAIRD 250D is an NFET pair in which one of the word lines, but not the other, being high will discharge bit line BL. PAIRD 250D adds one load to bit line BL.

Personalization of the NFET pair is done by placement of the vias when the semiconductor chip is manufactured. No changes to the ROX 251, the GND, the bit line (BL), the word lines (e.g., WL0, WL1), or the drain and source areas (D1, D2, D3) is needed. The bit line BL is never inverted, so that additional circuitry to logically invert selected bit lines is not required.

FIGS. 6A–6H shows various exemplary personalization of a bit line having 16 word lines. Personalizations are embodied using NFET pairs PAIRA 250A; PAIRB 250B; PAIRC 250C; and PAIRD 250D. For simplicity, instantiations of PAIRA 250A are simply labeled PAIRA; instantiations of PAIRB 250B are labeled PAIRB; instantiations of PAIRC 250C are labeled PAIRC; and instantiations of PAIRD 250D are labeled PAIRD. PAIRC is used when either word line in an NFET pair must cause discharge of the bit line. PAIRD is used when only one word line in an NFET pair must cause discharge of the bit line. PAIRA and PAIRB instantiations are selected by the designer of the ROM or a design automation computer program used to design the ROM, the selection ensuring that loading on the bit line is at least half the loading of a maximally loaded bit line. Note that parasitics other than sources and drains are ignored for simplicity.

It will be understood that ensuring that loading on the bit line being at least half the loading on the maximally loaded bit line minimizes a cycle time of the ROM, however embodiments of the invention can trade an increased cycle time of the ROM for lower loading and therefore lower power, as will be described later.

Figure 6A:
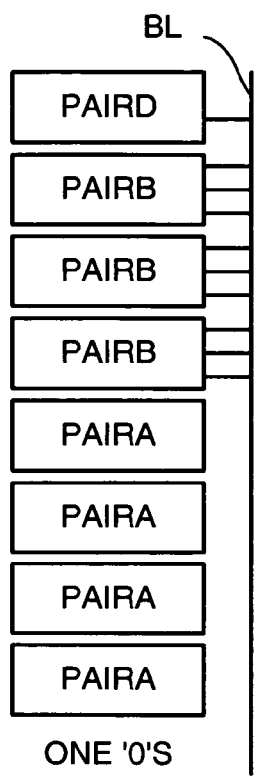
FIGS. 6A–6H show exemplary use of the various physical layouts shown in FIGS. 5A–5D to accomplish an improved bit line loading variation for various bit line personalizations on a bit line having 16 word lines.

In FIG. 6A, the personalization of bit line BL requires that only a single word line discharge bit line BL, indicated by the caption, one "0". PAIRD satisfies that requirement and adds one load to bit line BL. Three PAIRB NFET pairs are selected to add nine loads to bit line BL (three loads per PAIRB). Four PAIRA NFET pairs are selected for the remaining four NFET pairs, and add zero loads to bit line BL. Therefore bit line BL in FIG. 6A is loaded with 10 loads, even though only one word line is capable of discharging the bit line BL in FIG. 6A. As also explained earlier, a designer or design automation computer program selects PAIRA and PAIRB NFET pairs such that bit line BL is loaded with at least half as many loads as a maximally loaded bit line.

Figure 6B:
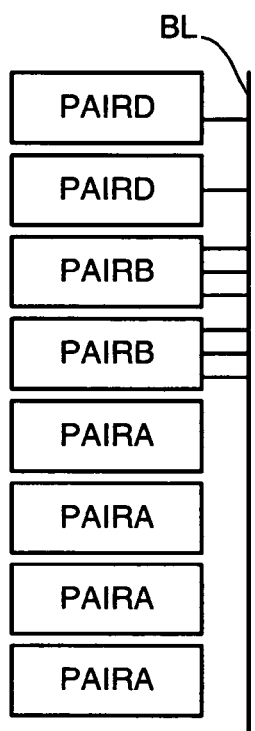

In FIG. 6B, two word lines must be able to cause discharge of bit line BL; however the two word lines are not in the same NFET pair. A PAIRD NFET pair is used for each NFET pair having a word line that must discharge bit line BL. Each PAIRD NFET pair adds one load to bit line BL. Two PAIRB NFET pairs are used, each adding three loads to bit line BL. Four PAIRA NFET pairs are used, adding no further loading to bit line BL. Bit line BL in FIG. 6B therefore has eight loads.

Figure 6C:
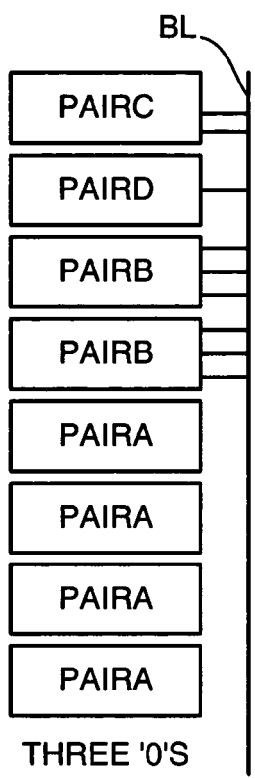

In FIG. 6C, two word lines in a first NFET pair each must be able to cause discharge of bit line BL. A single word line in a second NFET pair must also be able to cause discharge of bit line BL. A PAIRC (two loads) NFET pair is used for the first NFET pair and a PAIRD (one load) NFET pair is used for the second NFET pair. Two PAIRB NFET pairs are used, adding six loads to bit line BL. Four PAIRA NFET pairs are used, adding no loads to bit line BL. Bit line BL in FIG. 6C therefore has nine loads.

Figure 6D:
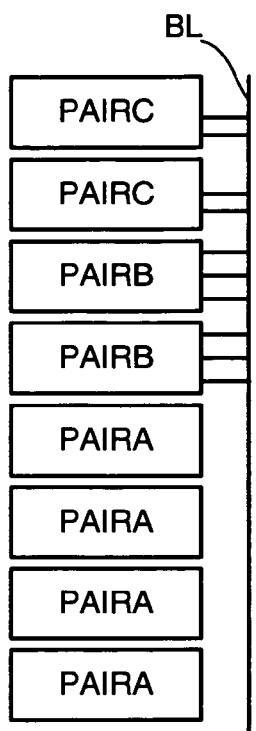

In FIG. 6D, two NFET pairs each have two word lines that must be able to cause discharge of bit line BL. Two PAIRC NFET pairs; two PAIRB NFET pairs; and four PAIRA NFET pairs are used, totaling 10 loads on bit line BL.

Figure 6E:
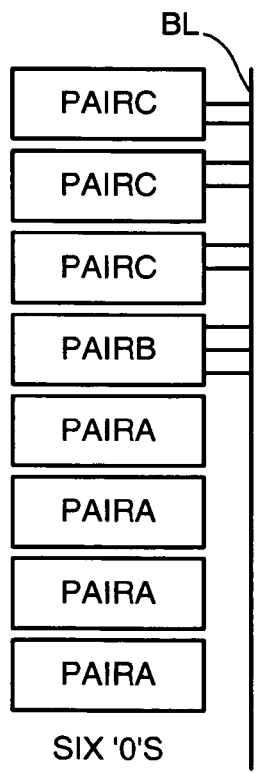

In FIG. 6E, three NFET pairs each have two word lines that must be able to cause discharge of bit line BL. Three PAIRC NFET pairs; one PAIRB NFET pair; and four PAIRA NFET pairs are used, loading bit line BL with nine loads.

Figure 6F:
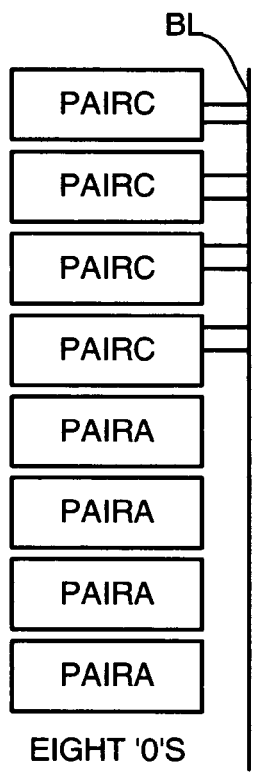

In FIG. 6F, four NFET pairs each have two word lines that must be able to cause discharge of bit line BL. Four PAIRC NFET pairs and four PAIRA NFET pairs are used, loading bit line BL with eight loads.

Figure 6G:
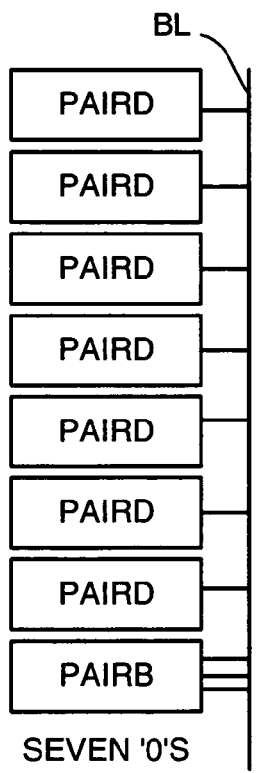

In FIG. 6G, seven NFET pairs each have one word line that must be able to cause discharge of bit line BL. Seven PAIRD NFET pairs and one PAIRB NFET pair are used, loading bit line BL with ten loads.

Figure 6H:
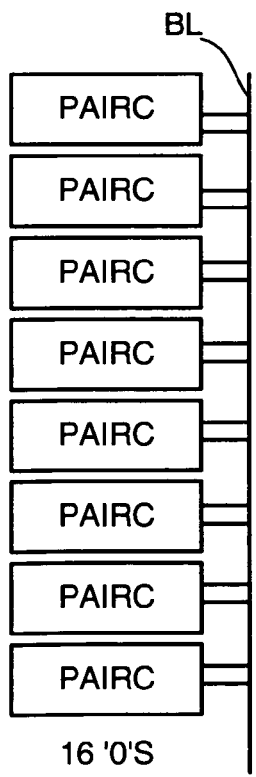

In FIG. 6H, all eight NFET pairs each have two word lines that must be able to cause discharge of bit line BL. Eight PAIRC NFET pairs are used, loading bit line BL with 16 loads.

Figure 7:
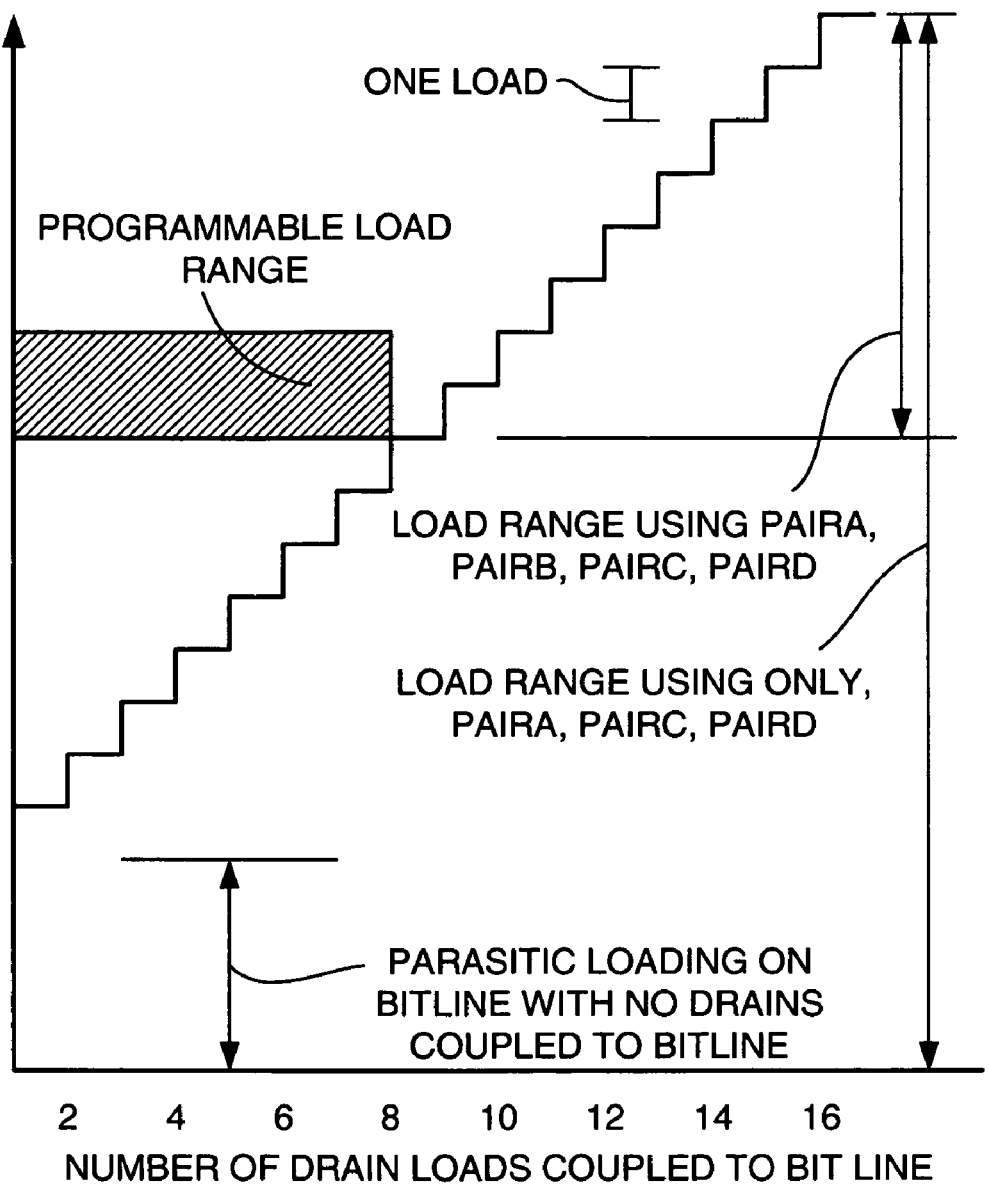
FIG. 7 shows a graph of bit line loading of a bit line using the present invention versus a prior art bit line loading scheme.

It will be noted that all bit lines, no matter what the required personality, can be loaded with at least half the loading of the most heavily loaded bit line. FIG. 7 is a graph showing increasing bit line loading versus number of loads (one to 16 loads in the example graph) that are required on a bit line for logical personalization requirements (i.e., for discharging the bit line). There will always exist some parasitic capacitive loading on a bit line, even if no loads are added by personalizing the bit line with source and drain loads. This capacitance includes capacitance of the PFET pullup, capacitance to signal and supply interconnect wiring running over the bit line, capacitance to other ground and bit lines on the same level of interconnect, and perhaps other parasitic capacitances that may exist in a particular ROM. This parasitic capacitance is shown as "parasitic loading on bit line with no drains coupled to bit line" in FIG. 7.

In a conventional ROM, using only PAIRA, PAIRC, and PAIRD NFET pairs, loading of the bit line is low when only one load, or just a few loads, is connected to a bit line. Each additional load increases the total loading on the bit line. The amount added per additional load is entitled "one load" in FIG. 7. The total loading variation can be quite large, even for the exemplary case where there are only a maximum of 16 loads. The total loading variation would be much larger for a bit line having, for example, 32, 64, or 128 maximum loads.

FIG. 7 illustrates the advantage of selected use of PAIRB NFET pairs. A bit line having any personality can be guaranteed to have at least half the number of loads as a bit line having every word line capable of discharging the bit line. Because a PAIRB NFET pair has three loads, as explained earlier, it is not always possible to increase loading of lightly loaded bit lines to exactly half the maximum number of loads, but the loading can be managed to be half the maximum number of loads, half the maximum number of loads plus one, or half the maximum number of loads plus two. "Programmable load range" indicates the range of loading that can occur on bit lines having less than half the loading of the maximally loaded bit line.

Because every bit line can be guaranteed to have at least half the maximum number of loads, variability in the time needed to precharge and discharge the bit line is reduced. This reduction in variability in the time needed to precharge and discharge the bit line allows, as explained earlier, a faster cycle time of the hierarchical ROM.

It will be understood that while the above examples and explanation illustrate how each bit line in plurality of bit lines can be loaded with at least half the loading of a maximally loaded bit line, the invention is not limited to loading each bit line to at least half that of the maximally loaded bit line. Each bit line can be managed to be at least some loading fraction (i.e., ratio of an instant bit line to the maximally loaded bit line) equal to or less than half of the maximally loaded bit line. Using the PAIRA 250A, PAIRB 250B, PAIRC 250C and PAIRD 250D NFET pairs described above it is impossible to guarantee that a loading fraction greater than 50% (although, as seen, some of the bit lines do have a loading fraction of greater than 50%). For example, suppose that each NFET pair has one word line that, when active, must discharge a particular bit line, and therefore, every NFET pair is personalized as a PAIRD 250D NFET pair. No PAIRB 250B can be used and a 50% loading fraction is the most that can be done. However, suppose that, for example, a 30% or 40% loading fraction is desired as the loading fraction. To implement a loading fraction less than 50%, fewer PAIRB 250B NFET pairs are used, and more PAIRA 250A NFET pairs are used, as explained below.

In an embodiment, the loading fraction is relative to a maximal loading that is an absolute maximum number of loads that could be added to a bit line. For example, if 64 word lines can personalize a bit line structure 204, the bit line would be maximally loaded with 64 loads, since a drain of 64 NFETs could be connected to the bit line if every word line were personalized to discharge the bit line.

In another embodiment, the loading fraction is relative to a maximal loading that is an actual maximum number of loads that are actually personalized on any bit line in the ROM 100. For example, if, as above, 64 word lines can personalize a bit line structure 204, but it is determined that there are never more than 60 word lines actually personalized to discharge any bit line in ROM 100, then the maximal loading is 60.

Consider the examples shown in FIGS. 6A–6H, and consider a loading fraction of 40%, rather than the 50% loading fraction used earlier. 40% of a maximally loaded bit line is 6.4 loads. Therefore each bit line must be loaded with seven or more loads.

In the following example, for simplicity and brevity, PAIRA is a PAIRA 250A NFET pair; PAIRB is a PAIRB 250B NFET pair; PAIRC is a PAIRC 250C, and PAIRD is a PAIRD 250D.

In the logic personalization of FIG. 6A, one PAIRD NFET pair is required for logical personalization. Six more loads are required to load the bit line with seven loads or more to comply with the present example having a loading fraction of 40%, so two PAIRB NFET pairs would be selected by the designer or the design automation computer program. The remainder of the NFET pairs would be PAIRA NFET pairs, which add no load to the bit line. In the logic personalization of FIG. 6C, One PAIRC and one PAIRD are required for logical personalization, for a total of three loads. Two PAIRB NFET pairs are required, resulting in a total loading of nine loads, with remaining NFET pairs being zero loads PAIRA NFET pairs. In the logic personalization of FIG. 6D, two PAIRC NFET pairs are required for logical personalization, giving four loads. One PAIRB NFET pair is required, giving a total of seven loads. PAIRA NFET pairs are used for remaining NFET pairs. A similar selection process is used for the remaining bit line logical personalization cases. Similarly, the loading fraction can be managed to other loading fraction values less than or equal to 50%.

The loading fraction is specified by the designer. Typically, the designer would choose a 50% loading fraction to minimize bit line loading variance and therefore minimize a cycle time of the ROM. However, a designer may choose a lower loading fraction to save power, while still reducing bit line loading variation to some degree. Choice of a loading fraction less than 50% increases variability of bit line loading and therefore, increases minimum cycle time of the ROM.

It will be understood that all bit lines in embodiments of the invention are of the same phase and therefore do not need selective inversion.

It will be further understood that while reducing loading variability on a bit line has been explained with reference to bit lines in an exemplary hierarchical bit line structure the invention is not limited to a hierarchical bit line structure. Loading variability on any bit line can be reduced using the teachings of the invention.

Figure 8:
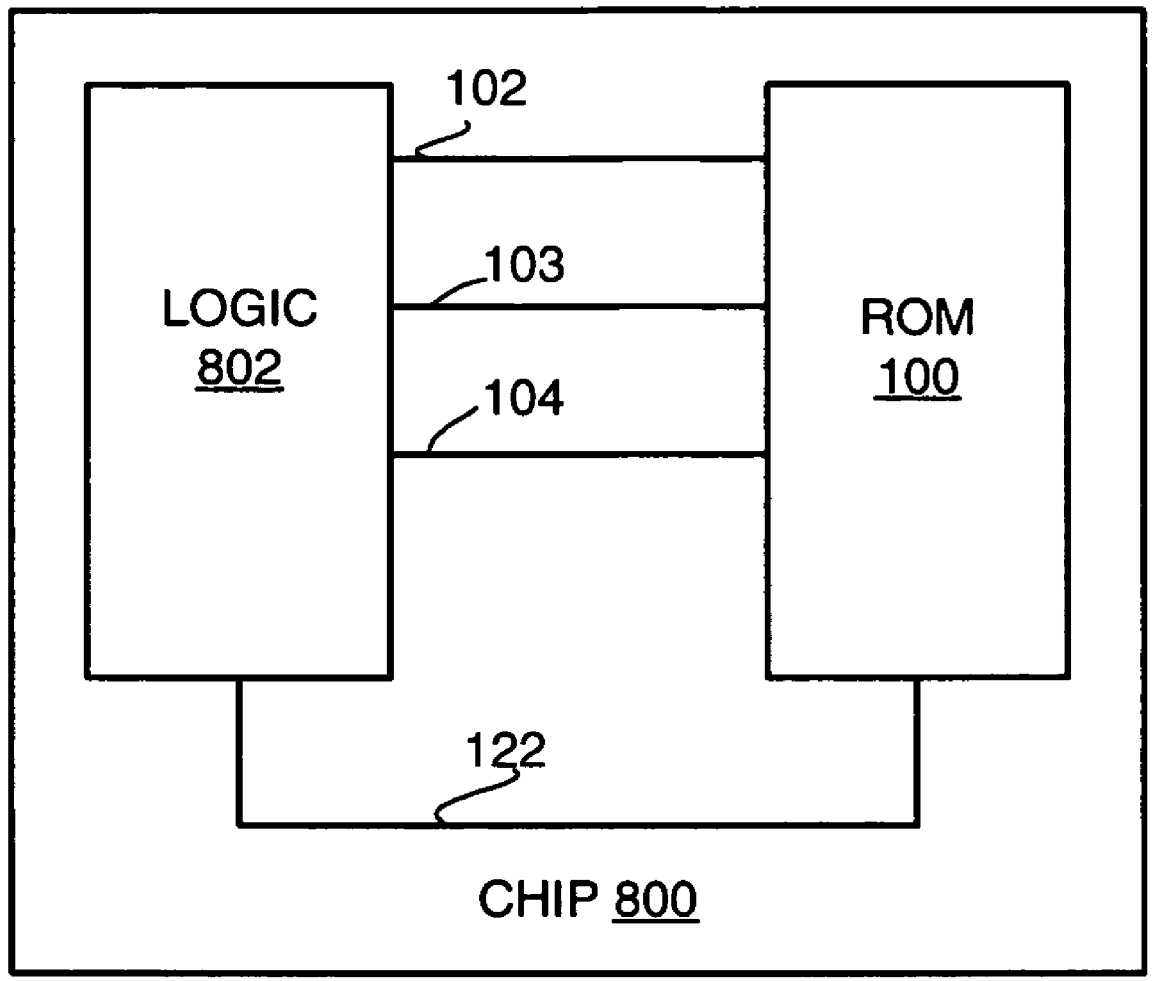
FIG. 8 is a block diagram of a semiconductor chip having a logic portion and a ROM.

It will be appreciated that ROM 100 can be a "stand alone" ROM product, that is, the ROM is itself a product that is sold as a semiconductor chip, or a semiconductor chip on a module. ROM 100 can also be embedded in a semiconductor chip also having other logic function. The logic function could include, for example, an ALU (arithmetic logic unit), a phase locked loop, static or dynamic RAM (Random Access Memory), registers, and the like. FIG. 8 shows a semiconductor chip 800 including ROM 100, and logic 802. Logic 802 communicates with ROM 100 over signal busses as described earlier. For example in semiconductor chip 800, logic 802 and ROM 100 communicate using a global precharge GPC 102; a local precharge 103, an address 104. Logic 802 receives data back from ROM 100 on bit lines 122 (e.g., 122A, 122N as shown in FIG. 2). Often, bit lines 122 are buffered before driving to logic 802.

Figure 9:
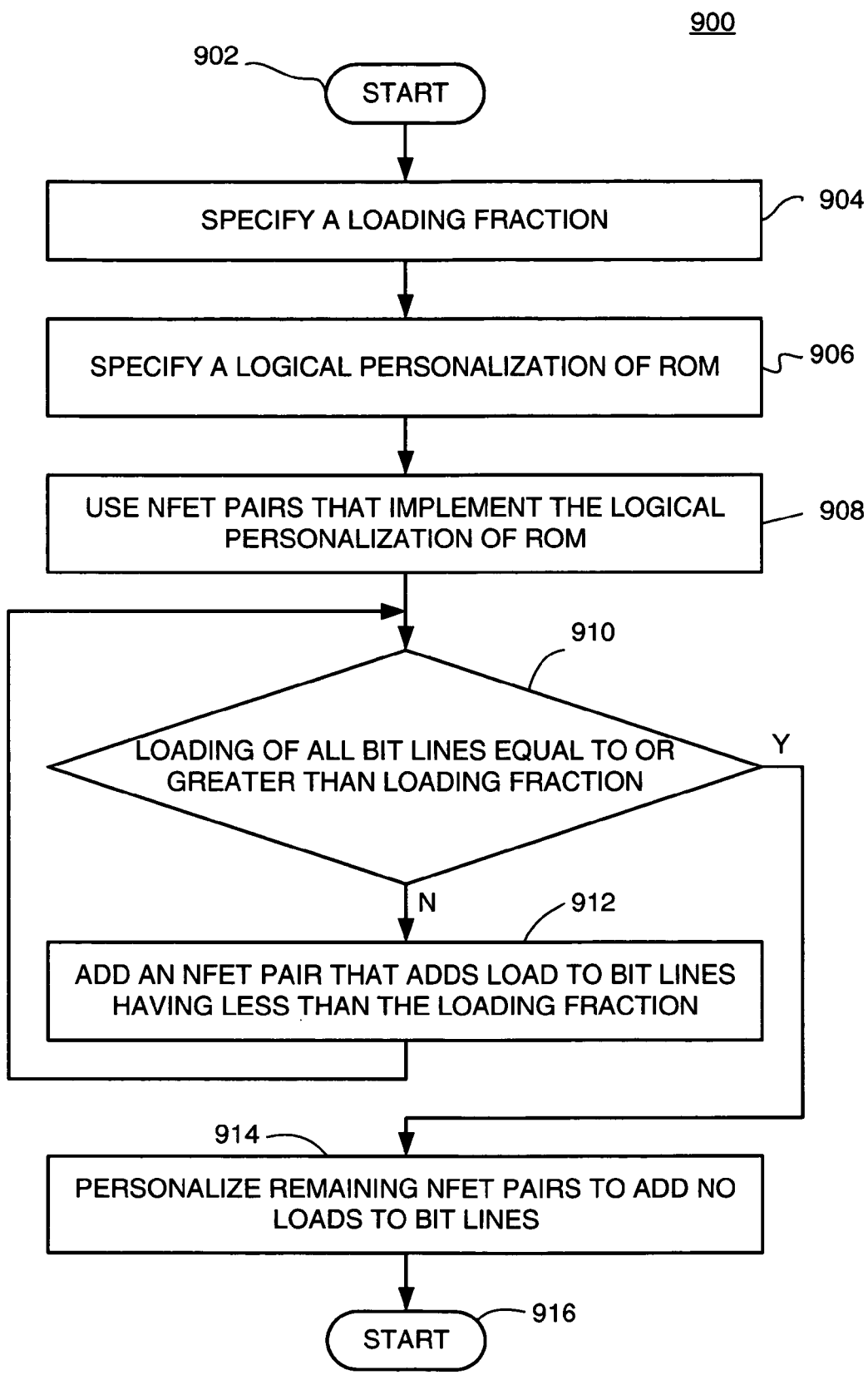
FIG. 9 is a flowchart of a method embodiment of the invention.

Embodiments of the invention can be expressed as methods. FIG. 9 is a flow chart of a method embodiment of the invention. Method 900 begins at step 902. In step 904, a loading fraction is specified by a designer, or, alternatively, is defaulted in a design automation computer program. The loading fraction defines how lightly loaded a particular bit line can be, relative to a maximally loaded bit line.

In particular, the loading fraction is a ratio of a number of loads on a particular bit line to a first load on a maximally loaded bit line that must be met. In an embodiment, the first load on the maximally loaded bit line is found by determining a number of loads that would be on the maximally loaded bit line if all loads that could be personalized on the maximally loaded bit line were actually personalized to place loads on the maximally loaded bit line. For example, if a bit line "could" be personalized with 100 loads, the first load in that embodiment would be 100.

In an alternative embodiment, the first load on the maximally loaded bit line is determined by finding an actual maximum personalized load on any bit line. For example, if a bit line "could" be personalized with 100 loads, but it is determined that no bit line is personalized with more than 80 loads the first load in the alternative embodiment is 80.

For either embodiment of determining the first load, the loading fraction is used to determine a minimum loading of other bit lines. For example, if the maximally loaded bit line has 100 loads (the first load), and the loading fraction is 50%, then all bit lines must have 50 loads or greater. The allowable value of the loading fraction is between zero and 50%. A 50% loading fraction minimizes a cycle time of the ROM. A loading fraction value less than 50% increases the cycle time of the ROM but reduces power requirements of the ROM.

In step 906, the designer specifies a logical personalization of the ROM. ROMs have many applications in electronic systems; several of which were given earlier. In the earlier example of a ROM being used to control a display, an ASCII character is input to the ROM, and bit lines appropriately personalized are output from the ROM to drive the display to show the ASCII character's pictorial representation.

In step 908, NFET pairs associated with each bit line are personalized to implement the logical personalization of the ROM. This process was described earlier in the description of the PAIRC 250C and PAIRD 250D NFET pairs shown in FIGS. 5C and 5D.

In step 910, loading of each bit line in the ROM is checked to see if it has enough loads to satisfy the number of loads required by the loading fraction and the maximally loaded bit line. If additional loading is required, control passes to step 912 which adds a padding NFET pair to a bit line needing additional loads. PAIRB 250B, shown in FIG. 5B, is such a padding NFET pair, which adds three loads to a bit line. Step 912 passes control to step 910. If step 910 determines that all bit lines have enough loads to meet the requirements of the loading fraction and the maximally loaded bit line, control passes to step 914. Step 914 personalizes remaining NFET pairs (i.e., NFET pairs not personalized in the logical personalization step 908 or the padding step 912) on each bit line to neither add loads to their associated bit lines nor alter the logical personality of the associated bit lines. Step 916 ends method 900.

What is claimed is:

1. A Read Only Memory comprising:
    a plurality of word lines;
    a plurality of bit lines; and
    a maximally loaded bit line in the plurality of bit lines having a first number of loads;
    wherein no bit line in the plurality of bit lines has less than a specified loading fraction of the first number of loads, and where all bit lines in the plurality of bit lines are of the same phase.

2. The Read Only Memory of claim 1 further comprising a particular bit line padded with one or more loads not required for logical personalization of the particular bit line to bring the particular bit line at least equal to the specified loading fraction of the first number of loads.

3. The Read Only Memory of claim 1 further comprising:
    a plurality of NFET pairs for each bit line in the plurality of bit lines;
    wherein each NFET pair comprises a first NFET and a second NFET, the first NFET and the second NFET having a shared source, a gate of the first NFET coupled to a first word line in the plurality of word lines, and the second NFET coupled to a second word line in the plurality of word lines.

4. The Read Only Memory of claim 3, wherein the plurality of NFET pairs in each bit line further comprises:
    a voltage supply that can be selectively contacted to a drain of the first NFET, the drain of the second NFET, and to the shared sources of the first NFET and the second NFET; and
    a bit line in the plurality of bit lines that can be selectively contacted to a drain of the first NFET, the drain of the second NFET, and to the shared sources of the first NFET and the second NFET.

5. The Read Only Memory of claim 4 further comprising a first type of NFET pair that adds three loads to a particular bit line in the plurality of bit lines;
    wherein the first type of NFET pair has the drain of the first NFET contacted to the particular bit line, the drain of the first NFET adding a load to the particular bit line;
    wherein the first type of NFET pair has the drain of the second NFET contacted to the particular bit line, the drain of the second NFET adding a load to the particular bit line; and wherein the first type of NFET pair has the shared sources of the first NFET and the second NFET contacted to the particular bit line, the shared sources adding a load to the particular bit line.

6. The Read Only Memory of claim 5 further comprising a second type of NFET pair that adds zero loads to the particular bit line in the plurality of bit lines;
- wherein the second type of NFET pair has the drain of the first NFET contacted to the voltage supply that can be selectively contacted to the drain of the first NFET;
- wherein the second type of NFET pair has the drain of the second NFET contacted to the voltage supply that can be selectively contacted to the drain of the second NFET; and
- wherein the second type of NFET pair has the shared sources of the first NFET and the second NFET contacted to the voltage supply.

7. The Read Only Memory of claim 5 further comprising a third type of NFET pair that adds two loads to the particular bit line in the plurality of bit lines;
- wherein the third type of NFET pair has the drain of the first NFET contacted to the particular bit line, adding a load to the particular bit line;
- wherein the third type of NFET pair has the drain of the second NFET contacted to the particular bit line, adding a load to the particular bit line; and
- wherein the third type of NFET pair has the shared sources of the first NFET and the second NFET contacted to the voltage supply.

8. The Read Only Memory of claim 5 further comprising a fourth type of NFET pair that adds one load to the particular bit line in the plurality of bit lines;
- wherein the fourth type of NFET pair has the drain of the first NFET contacted to the particular bit line, adding a load to the particular bit line;
- wherein the fourth type of NFET pair has the drain of the second NFET contacted to the voltage supply; and
- wherein the fourth type of NFET pair has the shared sources of the first NFET and the second NFET contacted to the voltage supply.

9. The Read Only Memory of claim 1, wherein the maximally loaded bit line is a bit line having as many loads as a number of word lines in the plurality of word lines that could be personalized to load the maximally loaded bit line.

10. The Read Only Memory of claim 1, wherein the maximally loaded bit line is a bit line having the most loads required by logical personalization requirements.

11. The Read Only Memory of claim 1 further comprising:
- a logic gate to combine more than one bit line;
- a local evaluate NFET controlled by an output of the logic gate, a source of the NFET coupled to a voltage supply; and
- a global bit line coupled to a drain of the local evaluate NFET;
- wherein the global bit line is discharged when any of the more than one bit lines is discharged.

12. A method of improving cycle time of a Read Only Memory having a plurality of word lines, a plurality of bit lines, and a plurality of NFET pairs, comprising the steps of:
- specifying a loading fraction that defines a ratio of load on a particular bit line to a first load on a maximally loaded bit line;
- determining the first load of a maximally loaded bit line in the plurality of bit lines; and
- ensuring that no bit line in the plurality of bit lines has less load than a loading fraction of the first load.

13. The method of claim 12 wherein the step of determining the first load of the maximally loaded bit line in the plurality of bit lines comprises the steps of:
- determining a maximum personalized load resulting if all word lines that could be personalized to discharge the maximally loaded bit line are personalized to discharge the maximally loaded bit line
- and
- using the maximum personalized load as the first load.

14. The method of claim 12 wherein the step of:
- determining the first load of the maximally loaded bit line in the plurality of bit lines further comprises the steps of:
- finding a maximum personalized load on any bit line in the plurality of bit lines required to logically personalize that bit line;
- and
- using the maximum personalized load as the first load.

15. The method of claim 12, further comprising the steps of:
- specifying a logical personalization of the Read Only Memory to define which word lines, when active, will discharge a particular bit line;
- selecting personalization of NFET pairs on each of the plurality of bit lines to implement the logical personalization of the Read Only Memory;
- If a particular bit line is loaded with less than a number of loads determined by the loading fraction and the first load, then personalizing one or more padding NFET pairs on the particular bit line to raise the loading of the particular bit line to equal or exceed the number of loads determined by the loading fraction and the first load, the padding NFET pairs adding loads but not changing the logical personalization of the particular bit line; and
- if there are remaining NFET pairs on the particular bit line, personalizing those remaining NFET pairs to neither change the logical personalization of the bit line nor adding loading to the particular bit line.

16. A semiconductor chip comprising:
- a read Only Memory further comprising:
- a plurality of word lines;
- a plurality of bit lines; and
- a maximally loaded bit line in the plurality of bit lines having a first number of loads;
- wherein no bit line in the plurality of bit lines has less than a specified loading fraction of the first number of loads, where the specified loading fraction is 50% or less, and where all bit lines in the plurality of bit lines are of the same phase.

* * * * *